United States Patent [19]
Bayer et al.

[11] Patent Number: 5,283,107
[45] Date of Patent: Feb. 1, 1994

[54] MODULAR MULTILAYER INTERWIRING STRUCTURE

[75] Inventors: Thomas Bayer, Sindelfingen; Johann Greschner, Pliezhausen; Willy Hildenbrand, Magstadt; Bernd Marquart, Schonbuch; Roland R. Stöhr, Nufringen; Olaf Wolter, Aidlingen, all of Fed. Rep. of Germany

[73] Assignee: International Business Machines Corporation, Armonk, N.Y.

[21] Appl. No.: 878,098

[22] Filed: May 4, 1992

[30] Foreign Application Priority Data

May 3, 1991 [EP] European Pat. Off. ......... 91107214.8

[51] Int. Cl.⁵ .............................................. B32B 9/00
[52] U.S. Cl. .................................. 428/209; 428/901; 428/210; 428/432; 428/433
[58] Field of Search ............... 428/209, 901, 210, 432, 428/433

[56] References Cited

U.S. PATENT DOCUMENTS

| | | | |
|---|---|---|---|
| 4,631,636 | 12/1986 | Andrews | 361/385 |
| 4,990,462 | 2/1991 | Sliwa, Jr. | 437/51 |

FOREIGN PATENT DOCUMENTS

| | | | |
|---|---|---|---|
| 0073486 | 8/1983 | European Pat. Off. | G11C 5/02 |
| 0267360 | 5/1988 | European Pat. Off. | H01L 23/52 |
| 0285064 | 10/1988 | European Pat. Off. | H01L 23/52 |
| 0315792 | 5/1989 | European Pat. Off. | H01L 23/48 |
| 0378016 | 7/1990 | European Pat. Off. | H05K 1/00 |

OTHER PUBLICATIONS

Extended Abstracts/Spring Meeting 88-1, vol. 15, No. 20, May 1988, Princeton, N.Y., pp. 66-67, C. Ting et al., "Silicon Interconnection Substrates for Multichip Packaging".

*Primary Examiner*—Patrick J. Ryan
*Assistant Examiner*—Cathy Lee
*Attorney, Agent, or Firm*—Lawrence H. Meier

[57] ABSTRACT

A modular multilayer interwiring structure comprising a plurality of relatively small parts which are produced separately as 'sub-units' (1). Each individual layer of the final structure is formed by joining a respective set of unit parts in one plane. The whole multilayer structure is then built by stacking these layers, preferably so that the units of one layer are not vertically aligned with the units of an adjacent layer. Each unit part includes at least one layer of conductive material (8, 9) on its front and/or rearside. These conductive layers may be individually patterned into diverse interconnection lines (5). Throughconnections (6) extending from the frontside to the backside of the units are provided using a desired set or a standardized array of via holes or openings filled with conductive material. By connecting desired throughconnections to the respective conduction lines, each unit may form an individual part of a more complex multilayer interwiring structure.

16 Claims, 6 Drawing Sheets

PRIOR ART
(MLC)

MODULAR MULTILAYER INTERWIRING STRUCTURE

FIELD OF THE INVENTION

The present invention relates to multilayer wiring substrates. More specifically, this invention relates to a new type of multilayer structure which can serve as interwiring substrates for use in semiconductor VLSI packaging technology.

BACKGROUND OF THE INVENTION

Due to high performance requirements in modern computer technology, pluralities of integrated circuits are usually combined with functional units. These units may include up to hundreds of integrated circuits which are commonly placed next to each other on the surface of a substrate component. As there are numerous data signals to transfer from and to each integrated circuit, the substrate typically comprises a dense and complex interwiring structure. Additionally, this structure must be stable with respect to mechanical and thermal stresses since the temperature of the integrated circuits varies significantly due to their actual activity level.

One structure comprising the requisite properties is the well known multilayer ceramic substrate (MLC). This substrate type typically consists of alumina that is, in many cases, compounded with other components, e.g., glass. Usually the integrated circuit semiconductor devices attached to and in surface contact with the substrate consist of monocrystalline silicon with a thermal expansion coefficient of $2.5 \times 10^{-6}$ per K. As alumina has a different expansion coefficient ($5.8 \times 10^{-6}$ per K), tension forces occur between substrate and the integrated device which may generate heat during operation of the device. Such heating of the device may result in shorter life times of the whole circuit/substrate unit. Therefore, standard MLC substrates require the use of stress reduction techniques, including effective cooling, limitation of chip size and specific connection techniques, e.g., controlled collapse chip connection (C4).

During MLC fabrication, different layers (carrying conduction lines for power distribution and signal transfer) are stacked to form a wiring network structure comprising a plurality of horizontal and vertical interconnections. To achieve a substrate of sufficient rigidity, the whole structure is 'baked' in a sintering process. This high temperature step must be carefully controlled due to the fact that significant shrinking of the substrate typically occurs. The sintering operation must be performed so that each individual layer, including its numerous vias for vertical wirings, exactly maintains its geometry and orientation with respect to the other layers of the stacked structure. If sintering is not performed with precise uniformity, it may cause opens and/or shorts of internal conducting paths, e.g., by dislocations of the vertical contacting vias. This leads to non-recoverable defective MLC substrates, because such internal wiring faults can not be repaired.

The fabrication of modern MLC substrates requires a whole sequence of various high precision process steps, with operations performed early in the sequence often having an impact on operations performed later in the sequence. Due to these dependencies, the possibilities for reworking the MLC substrates are generally limited. Accordingly, each notable modification of the MLC layout, either in size or internal wiring design, causes outstanding and expensive changes in equipment and processes. In addition, the substitution or renewal of tooling frequently causes undesired alterations of parameters which can result in defective products. As rework in most cases is virtually impossible, these inherent difficulties in MLC production lead to substantial yield limitations.

SUMMARY OF THE INVENTION

The present invention provides a new type of interwiring substrate and an improved technique for its fabrication.

The present invention has a modular substrate construction, wherein various parts of relatively small size are produced separately as 'sub-units'. The latter are then combined to form the multilayer interwiring structure. The unit parts are planar pieces, preferably of geometric shape (e.g., quadrangle, triangle or hexagon) which can be placed next to each other so that no gaps or spaces exist between the unit parts. It is not necessary that all of these units have an identical shape.

Each individual layer of the final structure is obtained by joining a respective set of unit parts in one plane. The whole multilayer substrate is then built by stacking these layers so that a lateral displacement occurs from one layer to the other and vertically adjacent unit parts have their edges horizontally offset. The units in a given layer may be positioned so that no gaps exist between individual units. On the other hand, selected units may be omitted to leave spaces or voids which then can form channels in the final multilayer substrate. Such spaces or voids may be used for heat reduction, e.g., by causing air or other coolants to flow through the spaces or voids.

The unit parts consist of an insulating or semiconducting material, e.g., ceramics, glasses, glass-ceramics, silicon or composition materials. The unit parts include on their front and/or rear side at least one layer of conductive material which can be individually patterned into diverse interconnection lines. Throughconnections from the front side to the backside of the unit are obtained by a desired set or a standardized array of via holes or openings filled with conductive material that form electric paths penetrating the unit. By connecting desired throughconnections to the respective conduction lines or conduction layers on the front and/or back side of the unit, each unit can form an individual part of a more complex multilayer interwiring structure.

During assembly of the final multilayer interwiring structure, the different units are connected, e.g., by known brazing or soldering techniques. Each unit part comprises individual sets or standardized arrays of surface pads suitable for soldering or brazing, with the pads of the unit parts on a given level being arranged so that they may be soldered or brazed to the respective pads of the unit parts in the layers immediately above and below the given level. Electrical interconnections between vertically adjacent unit parts may be simultaneously formed as desired using brazing or soldering pads connected to the respective conduction lines or conductive layers of each unit.

Electrical interconnection between laterally adjacent unit parts on a first layer of the interwiring substrate can be made by means of unit parts in a second layer via conduction lines which in the second layer cross the edges of unit parts in the first layer in another plane due to the respective displacement of the stacked layers.

The different layers of the final substrate can be electrically separated by insulating material, e.g., SiO$_2$, Si$_3$N$_4$ or polyimide. As a result of this separation, the desired surface contact pads for brazing or soldering of the units remain uncovered due to respective openings or vias produced by standard techniques known in the art.

It is also possible to keep all stacked layers separated a small distance from each other, i.e., so the layers are not in planar physical contact. To achieve this separation, the brazing or soldering pads are arranged to protrude from the surface of the unit parts so that, after brazing or soldering, the spaces between the unit parts are sufficient to keep apart the conductive surface areas or surface interconnection lines of the units. Thus, no insulating coverage of the unit parts is necessary, thereby reducing the number of process steps and, additionally, enhancing the electric performance of the device due to decreased parasitic capacitances. Such decrease in parasitic capacitances is achieved as a result of the low dielectric constant of the air in the region between layers.

The modular concept of the present invention allows the construction of a great variety of interwiring substrates without major alterations in process tooling. Significant modifications can be achieved by adding or removing unit parts. Functional alterations of the substrates, e.g., adding electrical connections required by new and more complex integrated circuits, are also easy to obtain. To achieve such alteration, additional layers are appended or the combination of the unit parts is altered and/or specific unit parts of the substrate are modified as required. Because incremental technological developments typically involve changing only part of the substrate, it will be sufficient in most cases to modify only a few individual unit parts, keeping the majority unchanged. Thus, standard unit parts can be used in a great variety of multilayer substrates.

According to the modular concept of the present invention, zero-defect multilayer substrates are easy to assemble because each sub-unit can be tested separately and only faultless parts are selected for further processing. Such separate testing will result in a high quality level and raise yield rates.

An additional advantage of the new concept is that different units of individual shape and/or wiring function can be produced simultaneously and joined finally to the desired substrate. By comparison, actual MLC fabrication requires a whole and contiguous sequence of high precision process steps to reach a defect-free terminal product. With the modular technique of this invention, the majority of process steps involved in fabricating a unit part can be accomplished and optimized independently.

BRIEF DESCRIPTION OF THE DRAWINGS

For a better understanding of the present invention, reference should be made to the following description of the invention and the accompanying drawings, in which.

DETAILED DESCRIPTION OF THE INVENTION

Figure 1:
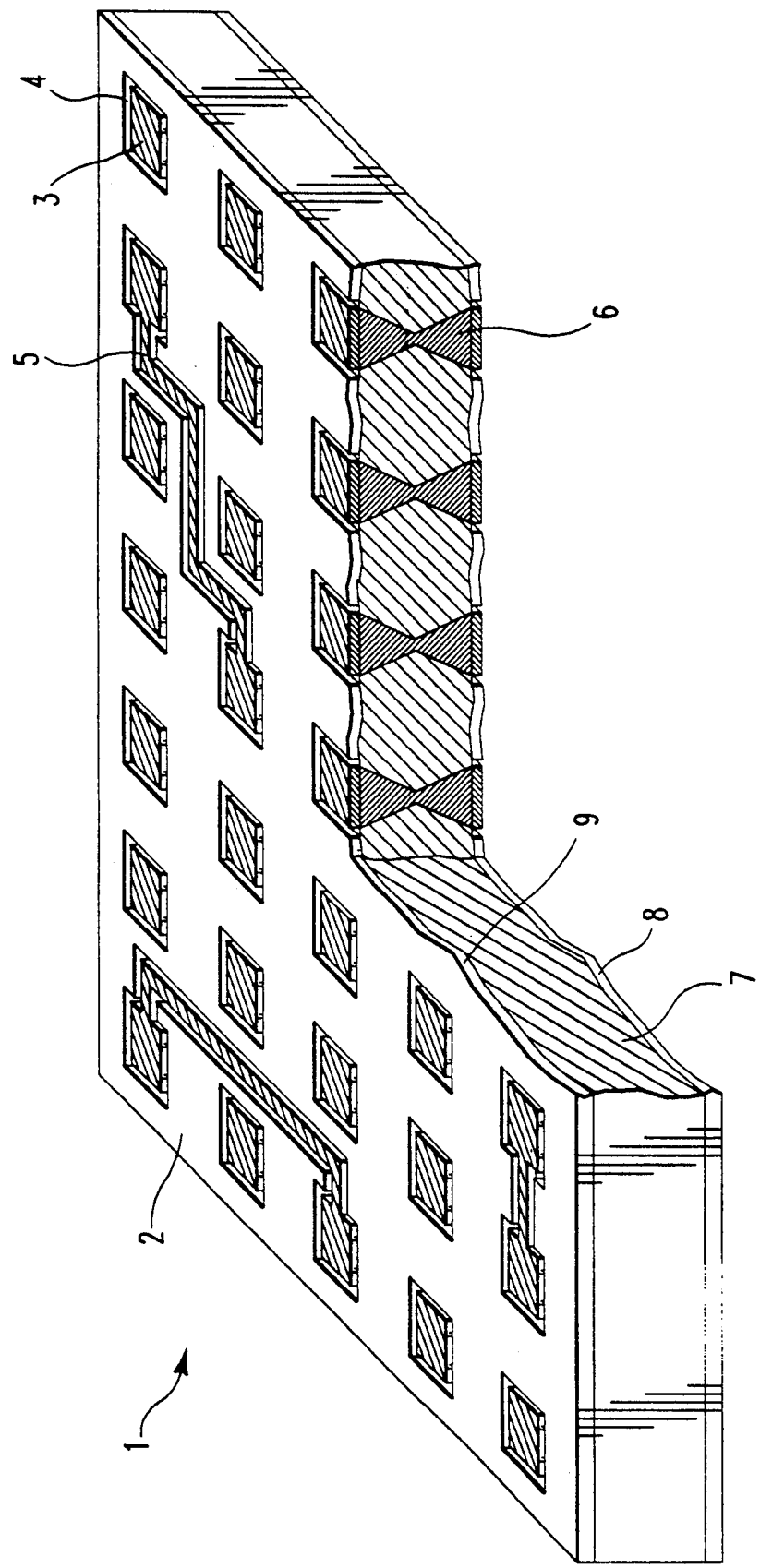
FIG. 1 is a perspective view of one sub-unit of the invention, with a portion of the unit being cut away to reveal details of the interior of the sub-unit.

The present invention is a new interwiring substrate comprising a plurality of stacked layers which are joined together by brazing or soldering. Each layer comprises a plurality of individual sub-units placed next to each other. A typical unit 1 of the preferred embodiment is shown in FIG. 1, the unit having a top surface 2 of square shape. The units may also have other geometric shapes. If desired, cooling channels may be provided by arranging the units in a given layer so that small spaces are left between the units. In the preferred embodiment, each layer of units constitutes a densely packed plane without any spaces or voids between the units.

Each unit 1 preferably consists of an insulating or semiconducting material 7 and comprises a set of surface contact pads 3. These pads may be individually arranged as required to achieve the desired vertical conduction paths to the next layer or as a standardized array. With the standardized array, each surface contact pad represents the terminal area of a throughput connection or via 6. This generates a standardized array or matrix of throughputs, each electrically connecting the respective paired front side and backside surface conduction pads. Due to this uniformity of design, the majority of the units can be produced up to this process level as identical parts. Individualization (personalization) is then obtained by applying particular surface conduction lines 5 that interconnect specific contact pads 3.

In the preferred embodiment, the units consist of monocrystalline silicon and are cut out of standard wafers used in semiconductor technology. This material selection allows the generation of vias 6 by use of anisotropical etching, including known dry (reactive ion etching) or wet etch techniques. Other methods, e.g., micro drilling or LASER-beam etching or micro-electro-erosion, may also be used to form vias 6. Using standard 100 oriented Si-wafers, anisotropical wet etching leaves holes having the shape of a square based pyramid. Openings are thus generated by etching simultaneously from both sides until the 'tips' of the pyramids are overlapping to an amount sufficient to assure vias of the desired width. Electrical connections from one side of the unit to the other are then formed by filling these structures with a conductive or superconducting material using deposition techniques such as sputtering, evaporating, chemical vapor deposition, plating baths or other techniques known in the art. Prior to filling vias 6 with conductive materials, the walls of the throughput holes are preferably covered with a dielectric substance such as $SiO_2$ (preferably thermal $SiO_2$) or $Si_3N_4$ to separate the conductive inner material from the surrounding monocrystalline silicon with an insulating layer. This dielectric layer can simultaneously be extended to serve as a primary coverage of the front and backside surface of the units (see FIG. 3, ref. no. 11).

As illustrated in FIG. 1, the frontside and backside of each unit is covered with a thin layer 8,9 of a conductive material, e.g., a metal, an alloy or a doped semiconductor, which layer can be deposited by the techniques mentioned above. For good electric performance, materials with low electric resistivity such as copper, aluminum-copper, tungsten-silicide or titanium-silicide or others well known in the art are preferably used. For specific applications, superconducting materials may also be used for the layers 8, 9. It is of course possible to use one material for the frontside of the unit and another material for the backside of the unit. The surface contact pads 3 on the frontside and backside are generally electrically insulated from the surrounding conductive layer 8, 9, e.g., by a separating space 4 which is formed by means of standard structuring techniques known in the art. This separating space is simply left out if connection of specific contact pads to the respective conduction layer 8, 9 or conduction line 5 is desired.

Surface conduction lines 5 may be formed out of the conductive layers 8, 9, preferably with standard lithographic or photolithographic techniques. In the preferred design shown in FIG. 1, conduction lines are generated only on the frontal side 2 of the unit and the backside remains totally covered with conductive material 8, except for the separating spaces or rings 4 needed for contact pad isolation. Other embodiments may carry conduction lines on both sides, thus allowing a more complex wiring. The preferred embodiment has the advantage that such a contiguous conductive plane serves as a field shield and/or can be used as a low resistance power/ground distribution layer within the final multilayer interwiring structure.

Figure 2A:
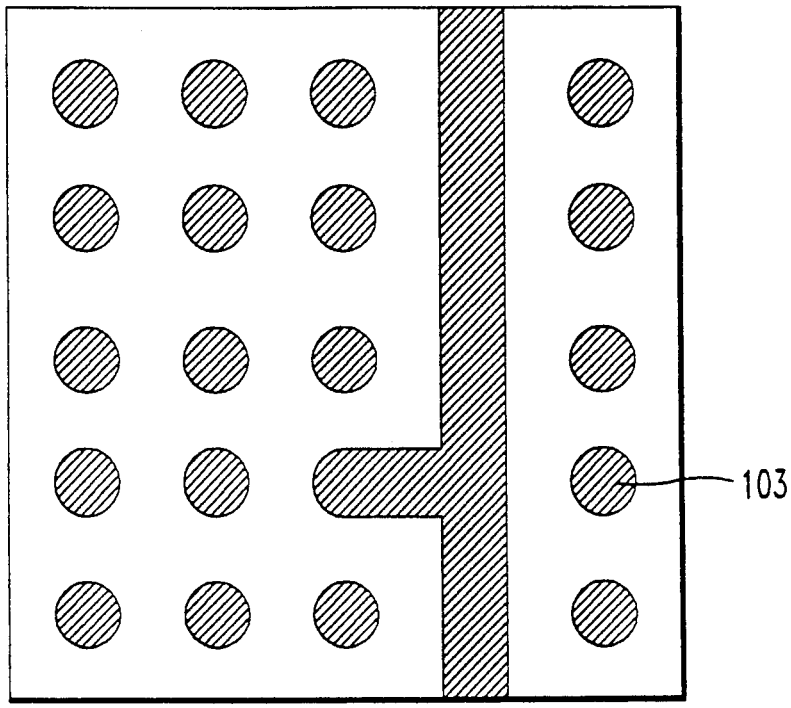
FIG. 2a is a top view of a prior art multilayer ceramic substrate, including surface conduction lines for interconnecting an array of surface contacts.
Figure 2B:
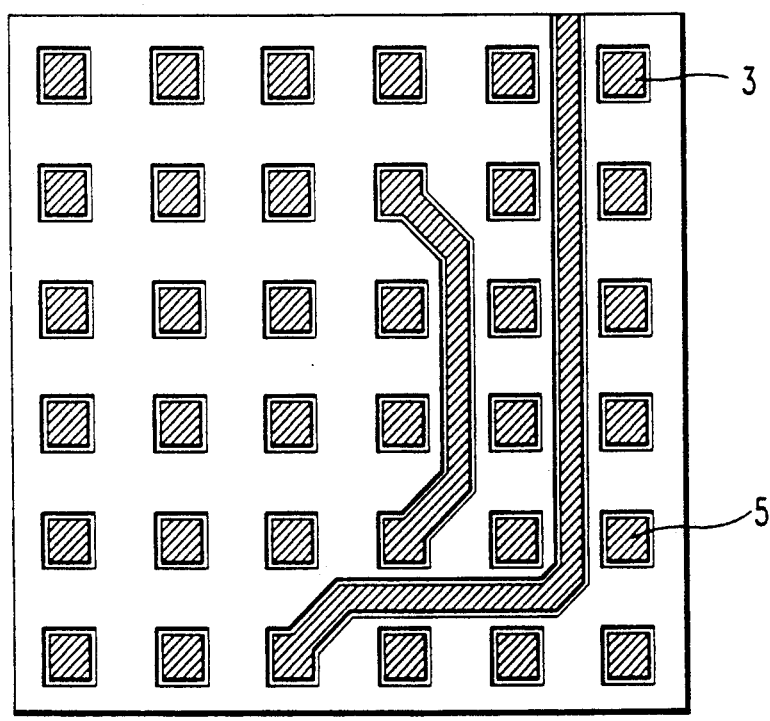
FIG. 2b is a plan view of a sub-unit of the type illustrated in FIG. 1 showing the preferred arrangement of surface contacts and surface conduction lines.

As shown in FIG. 2B, surface conduction lines interconnecting specific surface contact pads run between these pads without disturbing the matrix arrangement. This arrangement is in contrast to actual MLC techniques, wherein each interconnection line reduces the number of available contact pads since the lines are placed to intersect all of the pads positioned between a selected pair of pads to be electrically connected, as shown in FIG. 2A. With the use of patterning techniques from the field of integrated circuit production, it is furthermore possible to reduce the size of the conducting lines, thus allowing several lines to pass between two pads (an example with three such lines is indicated schematically in FIG. 3).

Figure 3:
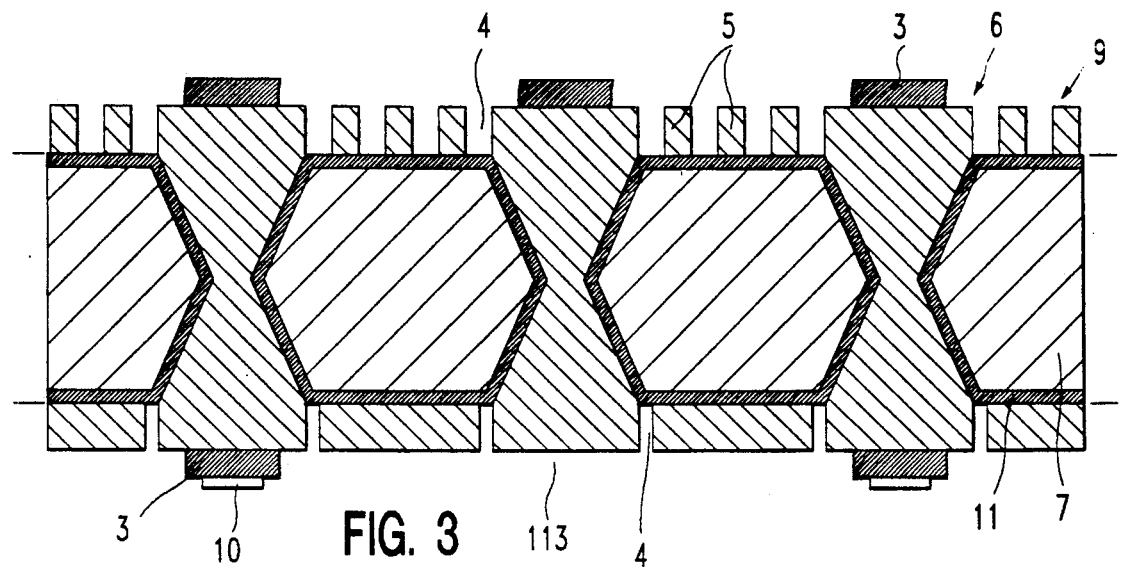
FIG. 3 is an enlarged cross-sectional view of a sub-unit taken along a plane extending parallel to one outer edge of the unit.

FIG. 3 is an enlarged cross-sectional view of a sub-unit taken along a plane extending parallel to a line of surface contacts on the sub-unit. To separate the conductive layers 8, 9 and the penetrating throughconnections 6 from the silicon base material 7, the latter is covered with an insulating layer 11 prior to deposition of conductive material. This layer preferably consists of $SiO_2$ or $Si_3N_4$, although other dielectric materials or combinations thereof will be suitable. It is also possible to use insulating layers differing in thickness and composition for various surface parts or for the walls of the vias.

In the preferred embodiment, the vias 6 are generated by anisotropical wet etching of the silicon base material 7, thus showing a typical bi-pyramidal shape. For electrical interconnection, all vias are filled with a conductive material, preferably copper due to its high electrical and thermal conductivity. Each of the plurality of throughconnections carry on both sides surface contact pads 3 consisting of a conductive material designed to serve as a wettable soldering or brazing substratum. These pads have a thickness sufficient to keep stacked units spaced apart a small distance after such units have been brazed or soldered together. Thus, the pads also function as spacers by creating a gap between conducting layers of vertically adjacent units. At least on one side of the unit additional conductive material 10 (FIG. 3) is deposited on the contact pads 3, which material is chosen from known metal, alloy or composition solder or brazing materials. This substance is melted later in the process sequence during joining of the stacked unit-layers.

Fabrication of a complex wiring network may require that specific throughconnections on selected units have no electrical contact with surface contacts of the units above or below. For example, it may be desired to electrically bridge laterally adjacent units by wirings on units only of one other layer, i.e., the respective vertically superposed lines of throughconnections in the final structure are only locally in electrical contact. To achieve such electrical isolation, the deposition of contact pads 3 and soldering/brazing material 10 on the terminal area of selected throughconnections (and on the corresponding areas of the throughconnections of the vertically adjacent units, respectively) is omitted, as indicated by reference numerals 113 and 115 in FIGS. 3 and 4.

Figure 4:
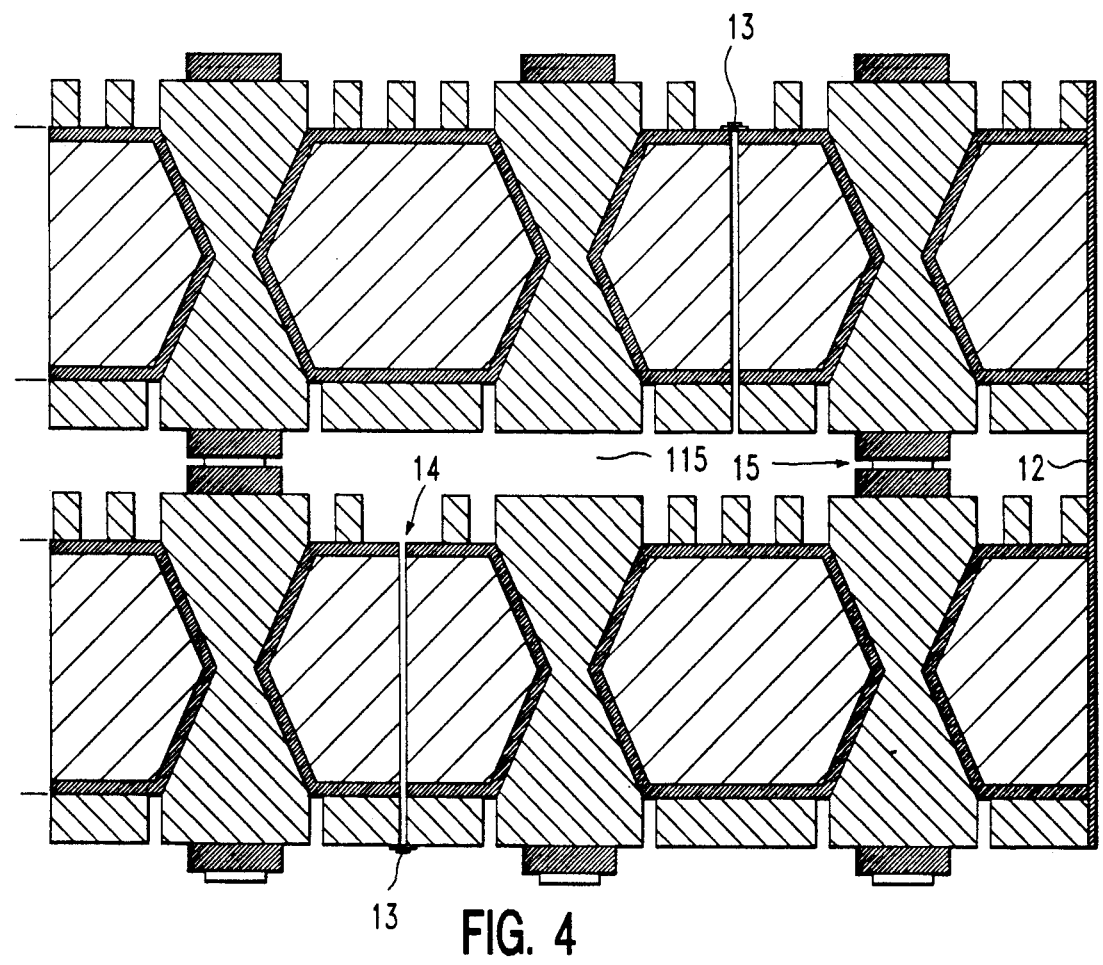
FIG. 4 is an enlarged cross-sectional view of two stacked layers of units incorporating the preferred interwiring structure, the view being taken along a plane extending parallel to an outer edge of the units.

FIG. 4 is a sectional view demonstrating the joining of units. In each plane of the final structure, units are placed next to each other, whereby in the preferred embodiment no voids or spaces remain between units. During assembly, such dense packing of the units allows an easy positioning of the units with respect to each other by directly using their sides as aligning edges 14 (FIG. 4). cut out of thin wafer disks, whereby with modern high precision dicing tools the desired accuracy can be achieved. The layers are stacked so that vertically adjacent units are displaced laterally. The units are connected by means of brazing or soldering pads 15. The majority of the units preferably carry a dense standard array of throughconnections which are in alignment with the throughconnection arrays of the adjacent layers above and below. Thus, after brazing or soldering, the final substrate comprises a set of vertically extending linear chains of throughconnections. Due to the fact that the volume of the vias is preferably filled with copper, a grid or bundle of thermoconducting 'bars' is formed within the body of the final multilayer substrate, which "bars" also serves to optimize heat distribution.

By sizing surface contact pads 3 or so that the units in one layer are spaced from the units in adjacent layers it is not necessary to cover the conductive layers 8, 9, including the surface conducting lines 5, with a non-conductive material which would otherwise be needed for insulation purposes. However, it should be considered that all conductive materials exposed to air must be chosen from those materials which are resistant to air-induced corrosive effects.

With this design, nearly all signal carrying wirings are mainly surrounded by air, i.e., are separated from each other by a medium with a dielectric constant close to one. Thus, parasitic capacitances are significantly reduced, resulting in faster signal propagation and downgraded cross-talk within the final multilayer structure.

For specific purposes, an alternative embodiment with units having covered surfaces and/or surface conduction lines may be superior. There are diverse substances known in the art which are suitable as a final surface layer, e.g., polyimide, $SiO_2$, PSG or BPSG (i.e., $SiO_2$ including phosphorus or in addition boron). With the alternative embodiment, at least parts of the stacked layers of the final multilayer substrate may be in direct physical contact with one another. Such contact allows a compact connection of the layers, particularly when optional polishing steps are performed prior to assembly. Within this embodiment, distance holders may be obsolete or can be formed as described above or by other structures such as protruding pins or sockets.

As illustrated on the right-hand side of FIG. 4, the sides of the multilayer substrate may be covered with a final plate or a layer 12, e.g., for surface protection. In addition, such layer 12 may also have a sealing effect which prohibits undesired exchange between the surrounding atmosphere and the interior of the substrate. Similarly, the edges of adjacent units formed by the dicing operation can be sealed, as indicated by reference number 13 (FIG. 4), to avoid capillary effects.

Although in FIGS. 1-4 only one conductive layer 8, 9 is shown on each side of the unit, it is also possible by use of standard techniques to prepare several conductive planes separated by insulating material and structured by known lithographic or other structure-defining techniques. Interconnections of individual conducting lines of these layers can be formed by means of respective vias. In this case, such a unit will already represent a 'low level' multilayer interwiring structure that may be included in a more complex substrate, as described in the embodiments discussed above.

It is also possible to include passive electronic elements (not shown) such as resistors or capacitors or even active electronic elements (not shown) such as diodes or transistors as parts of the units. Especially if the units are made from semiconducting materials, these elements can be formed directly as parts of the unit by using standard integration technologies. Thus, the final multilayer interwiring substrate may already comprise electronic functionality.

Figure 5:
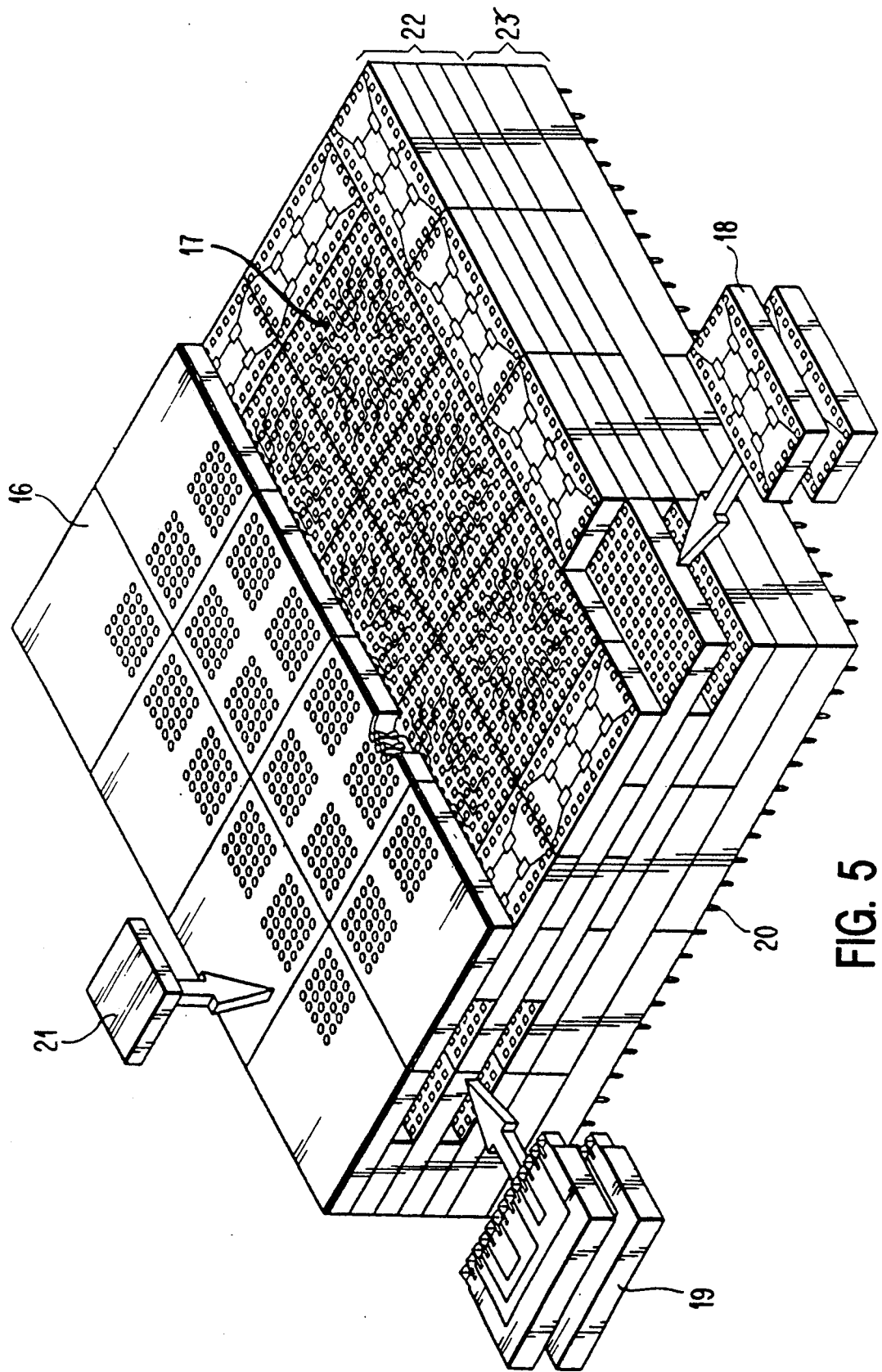
FIG. 5 is a perspective view of the final interwiring substrate.

The preferred embodiment of the final multilayer interwiring substrate is schematically shown in FIG. 5. The stacked layers of units 17 form the upper part 22 of the whole structure. The top layer of the structure consists of units 16 which include surface contact pads arranged to correspond to the respective integrated circuits 21, which may differ in size and/or numbers of contacts (not shown). Due to the displacement between the layers, recesses occur at the sides of the substrate. These recesses can be used for units 18 which may have a specific shape if a planar side of the final multilayer substrate is desired. It is also possible to use at least one of these recesses as a female part of a plug-in system. The corresponding insertion parts 19 may comprise sets or arrays of micro contacts selected from those described in a great diversity in the art.

It is a specific advantage of the present invention that this plug-in facility can be used for various purposes. For example, modifications of the inner wiring network after completion of the multilayer substrate can be made by insertion of plug-in parts 19 carrying contacts which are interconnected by means of respective conducting lines. Thus, repairing or customizing of the final interwiring substrate is possible. As the plug-in parts additionally may carry passive or even active electronic devices, a great variety of modifications of the final substrate is possible, particularly when such devices are made from semiconductive materials. Another application of plug-in parts is their use for functional tests or as a removable interconnection to external devices. In the latter case, wires can be attached to a plug-in device.

The bottom part of the multilayer substrate as shown in FIG. 5 is preferably built of a second set 23 of stacked layers which are formed similar to the first set, i.e., also consisting of sub-unit parts carrying wirings. As the backside of multilayer substrates typically comprise a plurality of contact pins 20, the lower layers and respective unit parts are preferably constructed to have a larger shape, thereby providing enhanced mechanical stability.

Figure 6:
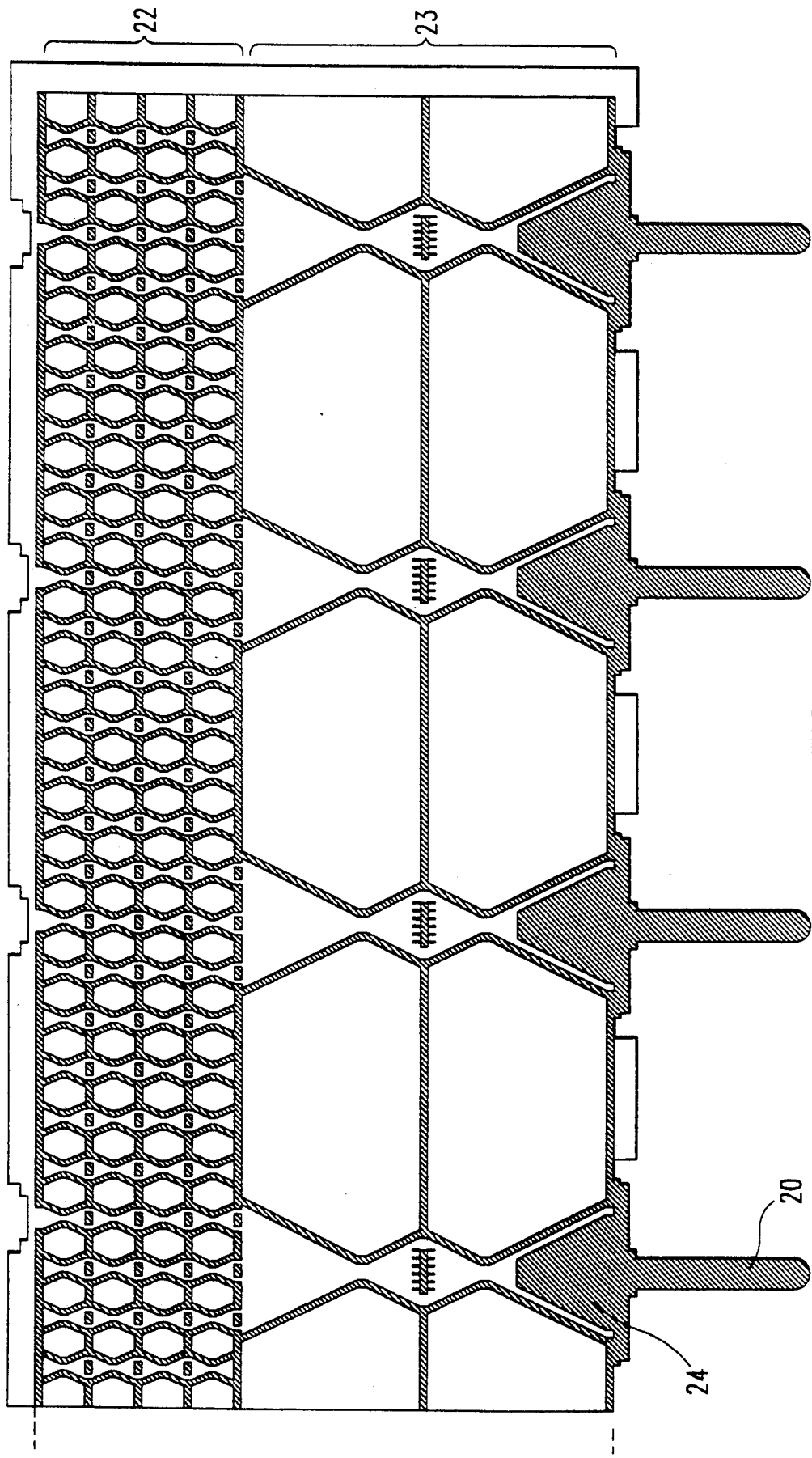
FIG. 6 is an enlarged cross-sectional view of the interwiring substrate illustrated in FIG. 5.

FIG. 6 shows an enlarged cross-sectional view of the embodiment illustrated in FIG. 5. Contact pins 20 are attached to the bottom layer of the lower stack 23 by soldering or brazing techniques. Preferably, the sub-units used for building the layers of the lower stack also consist of monocrystalline silicon, which allows formation of vias by means of anisotropical etching, as already described. These vias can easily be made asymmetric by adjusting the respective front and backside mask. The remaining vias or holes then have the shape of square pyramids which can be used to hold the pins very tight, as their base portions 24 may be formed to fit into the respective recesses of the bottom layer. Such construction of the vias and pins provides a self-aligning effect during assembly of the pins and generates a connection which tolerates mechanical stresses.

Figure 7:
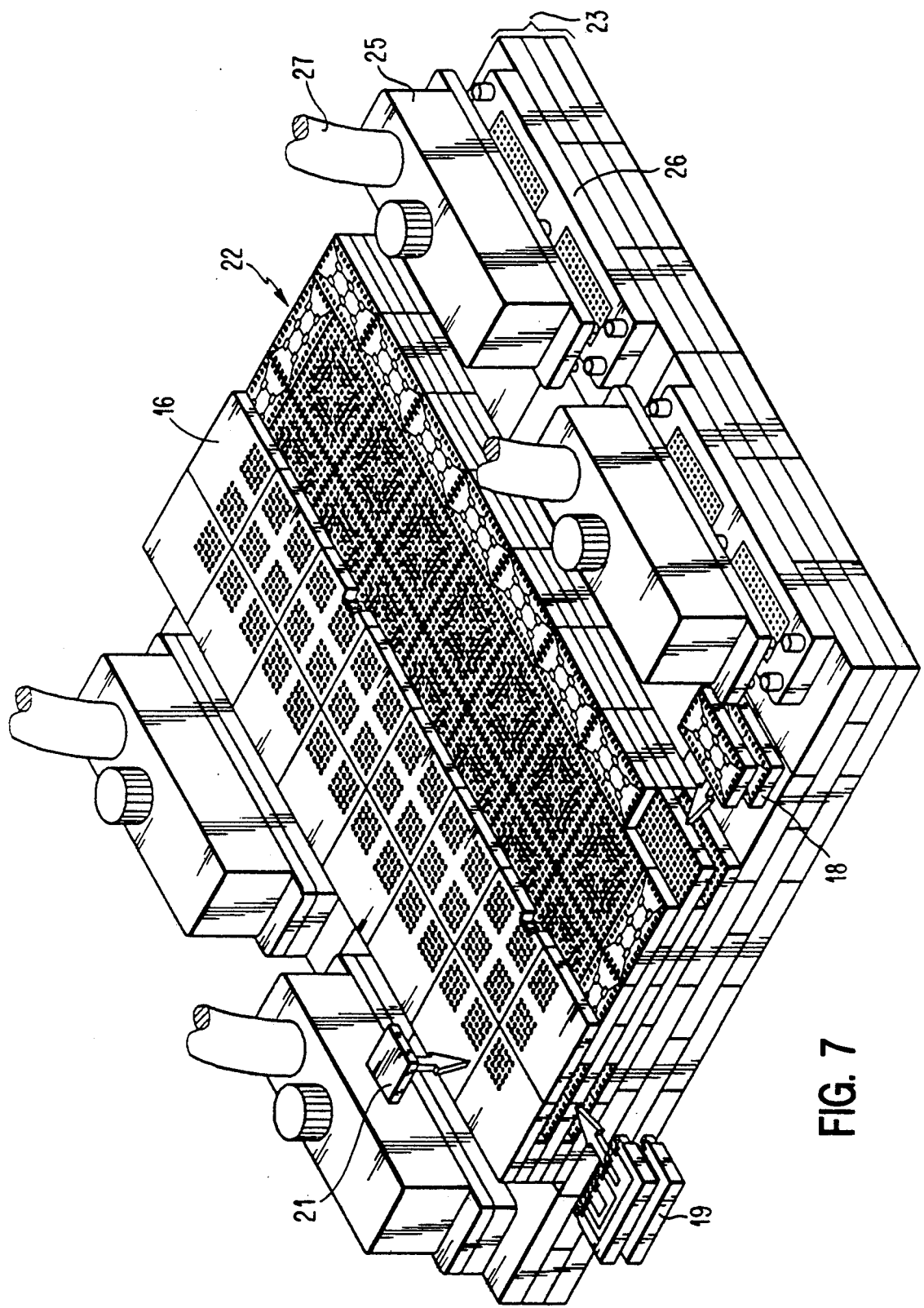
FIG. 7 is a perspective view of an alternative embodiment of the interwiring substrate.

An alternative embodiment of the present invention is shown in FIG. 7. In this embodiment, the lower layer stack 23 of the multilayer substrate is extended beyond the side of the first layer stack 22. By providing at least one plug-in socket 26 on the extended part of the lower layer, the whole substrate can be electrically joined to a board or other devices by means of corresponding connectors 25 and respective cables or bundles of wires 27. Thus, the backside pin array can be replaced by the connector layout of this embodiment.

The extended part of the bottom layer stack 23 can also be enlarged to permit additional multilayer stack parts 22 (not shown) to be supported thereon. Sets of individual multilayer stack parts 22 can be interconnected by a respectively dimensioned bottom layer stack 23, which replaces the prior art second level packaging boards.

Since certain changes may be made in the present invention without departing from the scope of the invention described herein, it is intended that all matter described in the foregoing specification or shown in the accompanying drawings be interpreted in an illustrative and not in a limiting sense.

What is claimed is:

1. A multilayer wiring structure comprising:
   a plurality of planar wiring units, each having top and bottom surface layers, at least one of which is made from an electrically conductive material, and each of said units being designed to be positioned in abutting relation to other units so as to permit two or more planar layers of wiring units to be formed;
   a plurality of throughconnections extending through each of said wiring units so as to conduct electricity from said top surface layer to said bottom surface layer of said units;

a plurality of contact pads attached to selected throughconnections; and wherein said surface layers include a plurality of openings, each for receiving at least portions of a corresponding respective throughconnection and/or contact pad, selected ones of said opening being sized so a gap exists between said surface layers and throughconnections and/or contact pads received in said selected ones of said openings such that said throughconnections and/or contact pads are electrically isolated from said surface layers.

2. A wiring structure according to claim 1, wherein said contact pads are sized to project beyond said surface layers so that when said wiring units are arranged in two or more abutting planar layers, said top surface layers of wiring units in one planar layer are spaced from said bottom surface layers of wiring units in adjacent planar layers, thereby forming a planar gap between adjacent layers.

3. A wiring structure according to claim 1, wherein selected ones of said plurality of wiring units include one or more surface conduction lines positioned to electrically couple selected throughconnections, said conduction lines being arranged so as to avoid making electrical connection with any throughconnections other than said selected throughconnections and each of said conduction lines being positioned so as to be at least partially located within the thickness of one of said surface layers.

4. A wiring structure according to claim 2, wherein said planar gap is filled with air.

5. A wiring structure according to claim 2, wherein said planar gap is filled with $SiO_2$.

6. A wiring structure according to claim 1, wherein each of said plurality of wiring units include a silicon substrate having opposing first and second surfaces, and an insulative layer covering said first and second surfaces, wherein said top and bottom surface layers cover said insulative layer.

7. A multilayer wiring structure comprising:

a plurality of wiring units, each comprising a planar substrate having opposing first and second outer surfaces, at least one of which is covered with a layer of conductive material, wherein each of said wiring units is designed to be positioned in abutting relation to other units so as to permit two or more planar layers of wiring units to be formed;

a plurality of throughconnections extending through each of said wiring units for conducting electrical current from said first surface to said second surface of said substrate; and one or more conduction lines deposited on at least one of said first and second outer surfaces of said planar substrates, wherein said conduction lines electrically couple selected throughconnection, said conduction lines being positioned at least partially within the thickness of said layer of conductive material.

8. A wiring structure according to claim 7, further comprising at least one plug-in connector sized and configured to be positioned in a recess located adjacent a peripheral edge of one of said layers of said wiring structure.

9. A wiring structure according to claim 7, further comprising a plurality of contact pads, each attached to a corresponding respective one of said plurality of throughconnection, for electrically connecting said selected throughconnections in a given layer of wiring units with throughconnections in wiring units in adjacent layers.

10. A wiring structure according to claim 9, further wherein said contact pads are sized and configured so as to be electrically isolated from said layers of conductive material.

11. A wiring structure according to claim 7, further wherein electronic elements, such as resistors, capacitors, diodes and transistors, are integrated in said planar substrate of selected ones of said wiring units.

12. A multilayer wiring structure comprising:

a plurality of wiring units each including a planar substrate having (a) opposing first and second surfaces, at least one of which is covered with a layer of conductive material, said layer of conductive material having a plurality of openings extending therethrough, and (b) opposing side edges, wherein each of said wiring units is positioned in abutting relation to other units so that said side edges of adjacent units confront one another and so that said units form a planar layer of wiring units;

two or more of said planar layers of wiring units arranged so that said first surfaces of said units or one layer confront said second surfaces of said units of an adjacent layer and so that said side edges of said units of one layer are not vertically aligned with said side edges of units of adjacent layers;

a plurality of throughconnections extending through each of said wiring units for conducting electrical current from said first surface to said second surface of said units; and one or more conduction lines positioned (a) in said openings in said layer of conductive material and (b) at least partially within the thickness of said layer of conductive material, said conduction lines being arranged so as to extend between, and electrically couple, selected throughconnections, said conduction lines being sized and positioned so as not to be electrically connected with (1) any throughconnections other than said selected throughconnections and (2) said layer of conductive material.

13. A wiring structure according to claim 3, wherein ones of said plurality of openings in said surface layers are sized and configured to receive said surface conduction lines such that said surface conduction lines do not make electrical contact with said surface layers.

14. A wiring structure according to claim 7, wherein at least two of said conduction lines extend between two immediately adjacent throughconnections.

15. A wiring structure according to claim 12, further including a layer of material deposited on outer edges of said wiring structure for sealing gaps between adjacent layers of wiring units.

16. A wiring structure according to claim 7, wherein said conduction lines are arranged so as to avoid making electrical connection with any throughconnections other than said selected throughconnections.

* * * * *